(12) United States Patent
Lai et al.

(10) Patent No.: US 8,194,370 B2
(45) Date of Patent: Jun. 5, 2012

(54) ELECTROSTATIC DISCHARGE PROTECTION CIRCUIT AND DEVICE

(75) Inventors: Ming-Fang Lai, Chiayi County (TW); Chung-Ti Hsu, Taipei (TW)

(73) Assignee: Nuvoton Technology Corporation, Hsinchu (TW)

( * ) Notice: Subject to any disclaimer, the term of this patent is extended or adjusted under 35 U.S.C. 154(b) by 501 days.

(21) Appl. No.: 12/397,352

(22) Filed: Mar. 4, 2009

(65) Prior Publication Data
US 2010/0128401 A1 May 27, 2010

(30) Foreign Application Priority Data

Nov. 25, 2008 (TW) ................................ 97145556 A

(51) Int. Cl.
*H01L 23/62* (2006.01)
(52) U.S. Cl. .......................................... 361/56; 257/355
(58) Field of Classification Search ...................... 361/56; 257/355–360
See application file for complete search history.

(56) References Cited

U.S. PATENT DOCUMENTS

| | | | |
|---|---|---|---|
| 4,630,162 A | 12/1986 | Bell et al. | |
| 5,473,183 A * | 12/1995 | Yonemoto | 257/371 |
| 5,744,842 A | 4/1998 | Ker | |
| 5,900,665 A * | 5/1999 | Tobita | 257/357 |
| 6,750,527 B1 * | 6/2004 | Momohara | 257/511 |
| 6,829,126 B2 | 12/2004 | Lee et al. | |
| 7,402,846 B2 | 7/2008 | Schwantes et al. | |

FOREIGN PATENT DOCUMENTS

CN 1748309 3/2006

OTHER PUBLICATIONS

"First Office Action of China Counterpart Application", issued on Dec. 14, 2010, p. 1-p. 6.
Authored by Yeh-Jen Huang, article titled "High-voltage ESD protection devices design in BCD process", adopted from NCTU MBA thesis of Yeh-Jen Huang. Jan. 2008.
Authored by Kawamoto, et al, article titled "A no-snapback LDMOSFET with automotive ESD Endurance" adopted from IEEE Transactions on Electron Devices, vol. 49, No. 11, Nov. 2002.

* cited by examiner

*Primary Examiner* — Danny Nguyen
(74) *Attorney, Agent, or Firm* — Jiang Chyun IP Office

(57) ABSTRACT

An electrostatic discharge (ESD) protection circuit is provided. The ESD protection circuit includes a first rail, a second rail, a first transistor and a resistance unit. The drain of the first transistor is electrically coupled to the first rail, and the source and gate of the first transistor are electrically coupled to the second rail. The resistance unit is electrically coupled between a body of the first transistor and the second rail. When ESD occurs, the resistance unit provides a resistance between the body of the first transistor and the second rail. An ESD protection device is also provided.

13 Claims, 15 Drawing Sheets

US 8,194,370 B2

ELECTROSTATIC DISCHARGE PROTECTION CIRCUIT AND DEVICE

CROSS-REFERENCE TO RELATED APPLICATION

This application claims the priority benefit of Taiwan application serial no. 97145556, filed on Nov. 25, 2008. The entirety of the above-mentioned patent application is hereby incorporated by reference herein and made a part of specification.

BACKGROUND OF THE INVENTION

1. Field of the Invention

The present invention relates generally to a circuit, and more particularly, to an ESD protection circuit and device.

2. Description of Related Art

An electrostatic discharge (ESD) voltage (or current) is generally much higher than the power supply voltage (or current) needed during normal operation. ESD occurring from various sources can strike electronic products in practical environments. When ESD occurs, it may cause the device to be burned out instantly.

To solve the above problem, the circuit typically may incorporate some ESD protection mechanism to effectively solve the device burnout problem caused by ESD current. In general, an ESD protection device is located between a core circuit and a pad to protect the core circuit. To obtain better result, the ESD protection device should have lower trigger voltage and uniform turn-on characteristic.

SUMMARY OF THE INVENTION

One embodiment of the present invention provides an electrostatic discharge (ESD) protection circuit including a first rail, a second rail, a first transistor and a resistance unit. The first transistor includes a body, a drain, a source and a gate. The drain of the first transistor is electrically coupled to the first rail, the gate and the source of the first transistor electrically coupled to the second rail. The first transistor is used to conduct an ESD current between the first rail and the second rail when ESD occurs. The resistance unit is electrically coupled between the body of the first transistor and the second rail and adapted to provide a resistance between the body of the first transistor and the second rail when ESD occurs.

Another embodiment of the present invention provides an ESD protection device including a doped region of a first conductive type, a first body of a second conductive type, a first heavily doped region of the first conductive type, a second heavily doped region of the first conductive type, and a resistance path. The doped region is disposed above a substrate. The first body is disposed in the doped region as a body of a first transistor. The first heavily doped region is disposed in the doped region and located outside of the first body. The first heavily doped region is electrically coupled to a first rail. The second heavily doped region is disposed in the first body. The second heavily doped region is electrically coupled to a second rail. The resistance path is electrically coupled between the first body and the second rail.

An ESD protection device including a doped region of the first conductive type, a first body of the second conductive type, a first heavily doped region of the first conductive type, a second heavily doped region of the first conductive type, a third heavily doped region of the second conductive type, and a second body of the second conductive type is provided. The doped region is disposed above a substrate. The first body is disposed in the doped region. The first heavily doped region is disposed in the doped region and located outside of the first body and electrically coupled to a first rail. The second heavily doped region is disposed in the first body and electrically coupled to a second rail. The third heavily doped region is disposed in the first body and is floating. The doped region, the first body, the first heavily doped region, the second heavily doped region and the third heavily doped region collectively form a first transistor. The second body is adjoining to the first body and is electrically coupled to the second rail.

DESCRIPTION OF THE EMBODIMENTS

Figure 1:
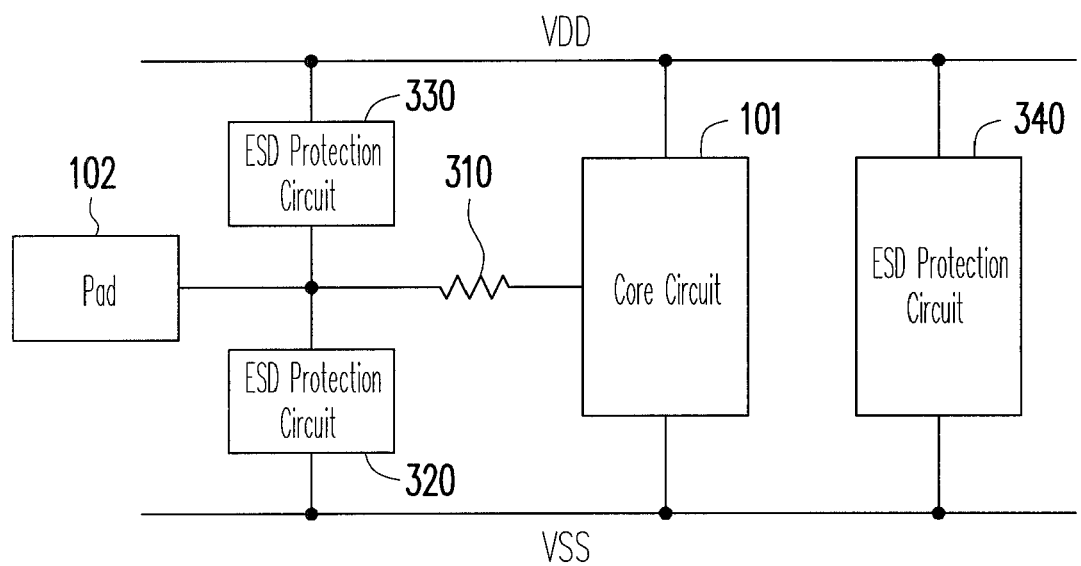
FIG. 1 is a block diagram of an ESD protection circuit disposed in an integrated circuit according to one embodiment of the present invention.

FIG. 1 is a block diagram of an electrostatic discharge (ESD) protection circuit disposed in an integrated circuit according to one embodiment of the present invention. While only two power supply rails, i.e., a power rail VDD and a power rail VSS, are shown in FIG. 1, the present invention should not be limited to the use with a single system voltage. Rather, it is contemplated that the present invention is also applicable in integrated circuits with multiple system voltages.

As shown in FIG. 1, a core circuit 101 represents a circuit to be protected and is powered by a power rail VDD and a power rail VSS. A pad 102 represents a node of the core circuit 101 for outputting/inputting signals to/from an external circuit. The pad 102 may be coupled to ESD protection circuits 310, 320 and 330. An ESD protection circuit 340 is coupled between the power rail VDD and the power rail VSS. When ESD occurs, most ESD current can be blocked by ESD protection circuit 310 from entering the core circuit 101, the ESD protection circuits 320, 330, and 340 can conduct a ESD pulse current from the pad 102 to the power rail VDD and/or power rail VSS, thereby avoiding direct ESD impact on the core circuit 101.

In general, an ESD protection device can be tested in four test modes, i.e., PD, ND, PS, NS modes. In PD or ND test modes, positive or negative pulse currents of the pad 102 can be conducted to the power rail VDD through the ESD protection circuit 330. Alternatively, the ESD pulse current can trigger the ESD protection circuit 320 such that the ESD pulse current can be conducted to the power rail VDD through ESD protection 320, power rail VSS, and ESD protection circuit 340.

In PS or NS test modes, the positive or negative pulse currents of the pad 102 can trigger the ESD protection circuit 320 such that the positive pulse current (or negative pulse current) is conducted to the power rail VSS. Alternatively, the pulse current can trigger the ESD protection circuit 340 such that the pulse current is conducted to the power rail Vss through ESD protection circuit 330, power rail VDD, and ESD protection circuit 340.

The ESD protection circuits 320, 330 and 340 can have a same or different circuit layout. For example, the ESD protection circuit 320 can be ESD protection circuits shown in FIGS. 2A to 2F, while the ESD protection circuit 330 can be a diode.

Referring to FIGS. 2A to 2F, exemplary embodiments of the ESD protection circuit of the present invention are illustrated. The voltage of second rail 420 is lower than voltage of a first rail 410 in FIGS. 2A to 2D, while the voltage of the first rail 410 is lower than the voltage of the second rail 420 in FIGS. 2E to 2F.

Figure 2A:
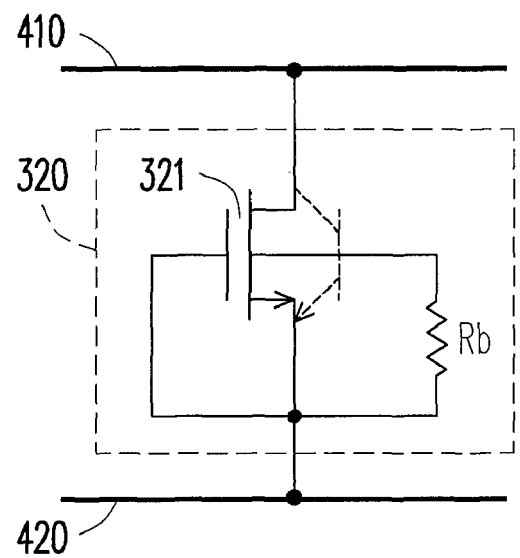
FIGS. 2A to 2G illustrate the ESD protection circuit according to one embodiment of the present invention.
Figure 2B:
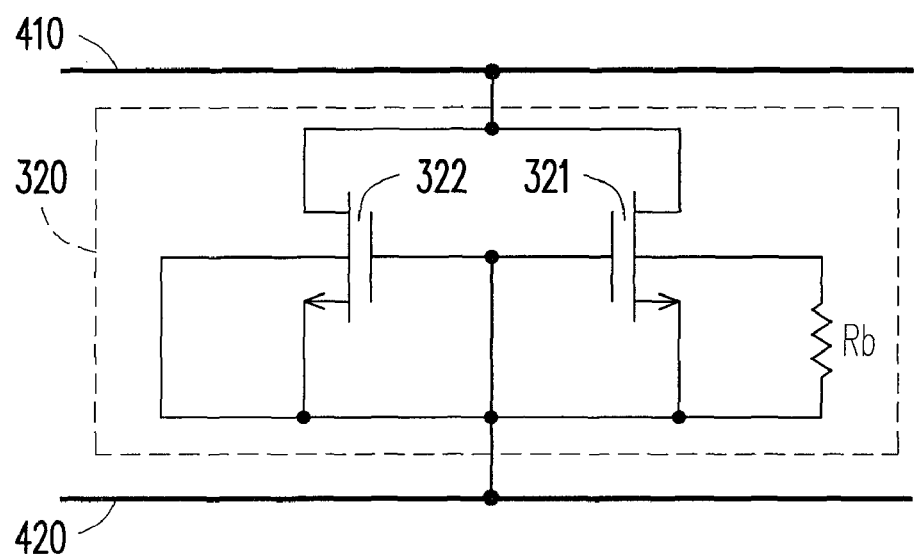
Figure 2C:
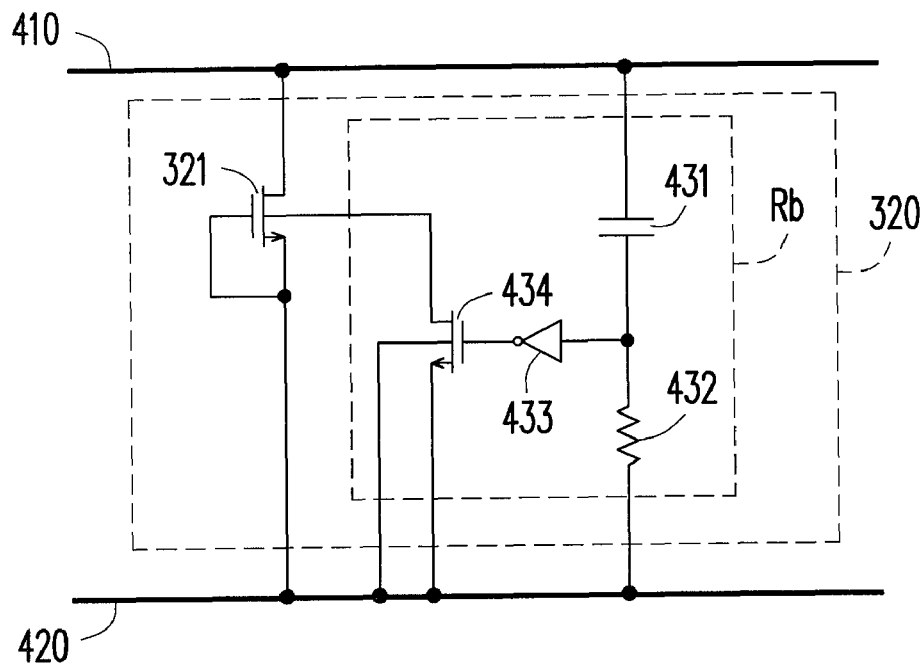
Figure 2D:
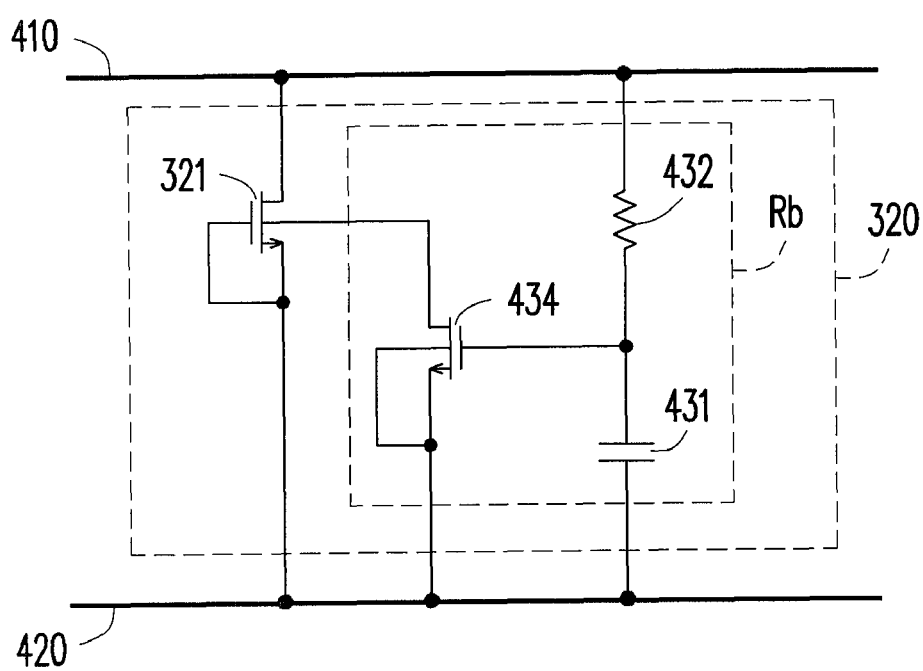
Figure 2E:
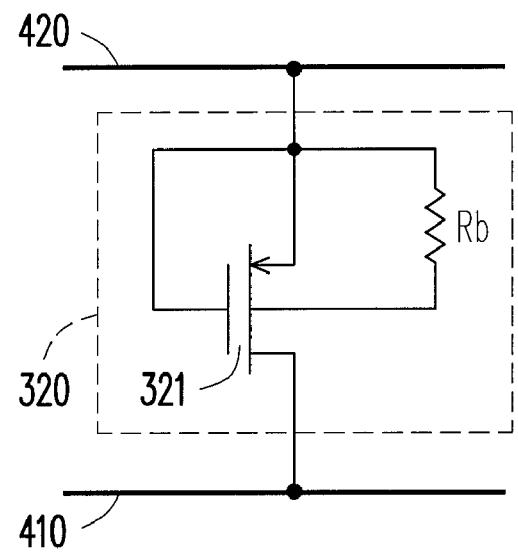
Figure 2F:
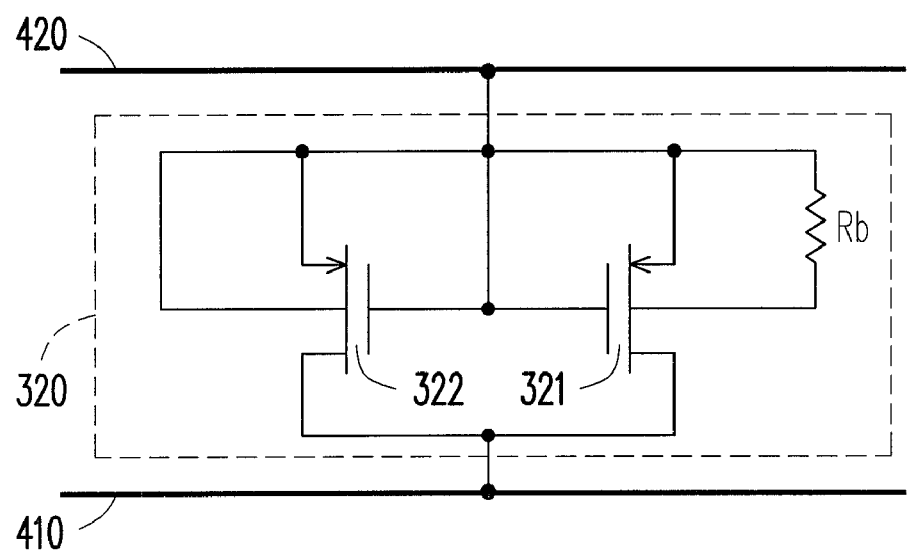

In regard to the ESD protection circuit 320, the first rail 410 and the second rail 420 of FIGS. 2A to 2D are respectively electrically coupled to the rail of the I/O pad 102 and the power rail VSS, and the first rail 410 and the second rail 420 of FIGS. 2E to 2F are respectively electrically coupled to the power rail VSS and the rail of the I/O pad 102. In regard to the ESD protection circuit 330, the first rail 410 and the second rail 420 of FIGS. 2A to 2D are respectively electrically coupled to the power rail VDD and the I/O pad 102, and the first rail 410 and the second rail 420 of FIGS. 2E to 2F are respectively electrically coupled to the I/O pad 102 and the power rail VDD. In regard to the ESD protection circuit 340, the first rail 410 and the second rail 420 of FIGS. 2A to 2D are respectively electrically coupled to the power rail VDD and the power rail VSS, and the first rail 410 and the second rail 420 of FIGS. 2E to 2F are respectively electrically coupled to the power rail VSS and the power rail VDD. The power rail VDD can be electrically coupled to system power. The power rail VSS can be ground.

As shown in FIG. 2A, the ESD protection circuit 320 includes a first transistor 321 and a resistance unit Rb. The first transistor may, for example, be a lateral diffused N-channel metal oxide semiconductor field-effect transistor (lateral diffused NMOSFET, LDNMOS) and may also be other N-channel MOSFET or N-type field oxide transistor.

The source and drain of the first transistor 321 may be respectively electrically coupled to the first rail 410 and the second rail 420, and the gate of the first transistor 321 may be electrically coupled to the second rail 420. When ESD occurs, the ESD voltage can cause a parasitic bipolar junction transistor to be turned on before the an avalanche of the first transistor 321 to enable the first transistor 321 to conduct the ESD current between the first rail 410 and the second rail 420. The resistance unit Rb is electrically coupled between a body of the first transistor 321 and the second rail 420. When an ESD occurs on the pad 102, the resistance unit Rb provides a resistance between the body of the first transistor 321 and the second rail 420.

The drain-body-source of the first transistor 321 forms the parasitic bipolar junction transistor (parasitic NPN transistor) where the body of the first transistor 321 acts as the base of the parasitic bipolar junction transistor. In the PS test mode (i.e., the second rail 420 is grounded), the body of the first transistor 321 is electrically coupled to the second rail 420 via the resistance unit Rb and, therefore, the positive pulse increases the voltage of the body of the first transistor 321 when ESD occurs on the pad 102, thereby turning the parasitic bipolar junction transistor on.

When ESD occurs, the resistance unit Rb can cause the voltage level of the body of the first transistor 321 to be uniformly increased, thereby turn the parasitic bipolar junction transistor on. Because the parasitic bipolar junction transistor has been turned on before the avalanche of the first transistor 321, the ESD protection circuit of the present embodiment can provide a low trigger voltage to protect the core circuit, especially, protect an output buffer of the core circuit.

FIG. 2B illustrates an alternative embodiment of the ESD protection circuit 320. FIG. 2B is similar to FIG. 2A except that the ESD protection circuit 320 of FIG. 2B further includes a second transistor 322. The second transistor 322 may, for example, be an N-type field oxide transistor, an LDNMOS or another type of transistor. In other embodiments, the second transistor 322 can be replaced with a PN diode.

The source and drain of the second transistor 322 are respectively electrically coupled to the first rail 410 and the second rail 420, and the body and gate of the second transistor 322 are electrically coupled to the second rail 420. When an ESD negative pulse occurs on the first rail 410, the ESD current flows from the second rail 420 to the first rail 410 through a parasitic diode (i.e., the parasitic diode formed by the body and drain of the second transistor 322).

In the above embodiments, the resistance unit Rb may be any resistive elements or resistors such as a conventional resistor, variable resistor, or a transistor. FIG. 2C illustrates another embodiment of the ESD protection circuit 320. FIG. 2C is similar to FIG. 2A except that the resistance unit Rb of FIG. 2C includes a capacitor 431, a resistor 432, an inverter 433, and a third transistor 434 instead of being a resistor as in the embodiment of FIG. 2A.

As shown in FIG. 2C, a first end of the capacitor 431 is electrically coupled to the first rail 410. First and second ends of the resistor 432 are electrically coupled to a second end of the capacitor 431 and the second rail 420 respectively. An input of the inverter 433 is electrically coupled to the second end of the capacitor 431, and an output of the inverter 433 is electrically coupled to the gate of the third transistor 434. The drain of the third transistor 434 is electrically coupled to the body of the first transistor 321. The source and body of the third transistor 434 are electrically coupled to the second rail 420. The third transistor 434 may be any N-channel MOSFET.

When ESD occurs on the first rail 410, and the second rail 420 is grounded, the voltage of the input of the inventer is increased due to the RC transient response of the capacitor 431 and the resistor 432. Thus, the voltage of the output of the inverter 433 is decreased. At this time, the output voltage of the inverter 433 causes the third transistor 434 to cut off (or approach to a cutoff state). Therefore, when ESD occurs, the third transistor 434 can provide a resistance between the body of the first transistor 321 and the second rail 420.

In addition, in a normal operating environment in which the first rail 410 electrically coupled to system power and the second rail 420 being ground, the capacitor 431 is fully charged. The input voltage of the inverter 433 approaches to ground voltage (e.g. zero voltage), thereby causing the output voltage of the inverter 433 to approach to the system voltage. At this time, the output voltage of the inverter 433 causes the third transistor 434 to turn on (or approach to a saturation state). Therefore, the body of the first transistor 321 is grounded.

FIG. 2D illustrates another embodiment of the ESD protection circuit 320. FIG. 2D is similar to FIG. 2C except that the inverter 433 is omitted in FIG. 2D. Referring to the resistance unit Rb in FIG. 2D, the first end of the resistor 432 is electrically coupled to the first rail 410. The first and second ends of the capacitor 431 are respectively electrically coupled to the second end of the resistor 432 and the second rail 420. The source and base of the third transistor 434 are electrically coupled to the second rail 420, and the drain of the third transistor 434 is electrically coupled to the body of the first transistor 321. The gate of the third transistor 434 is electrically coupled to the second end of the resistor 432.

When ESD occurs on the first rail 410, and the second rail 420 is grounded, the gate voltage of the third transistor 434 approaches to the voltage of the second rail 420 due to the RC transient response of the capacitor 431 and the resistor 432. Thus, the third transistor 434 to cut off (or approach to a cutoff state). Therefore, when ESD occurs, the third transistor 434 of FIG. 2D can also provide a resistance between the body of the first transistor 321 and the second rail 420. In addition, in a normal operating environment in which the first rail 410 supplies the system voltage and the second rail 420 supplies the ground voltage, a completion of charging of the capacitor 431 causes the gate voltage of the third transistor 434 to approach to the system voltage. At this time, the third transistor 434 is turned on (or approaches to a saturation state), such that the body of the first transistor 321 is grounded.

There are a number of configurations which those skilled in the art will readily identify upon reading the description of the above embodiments. For example, the first transistor 321 can be replaced with a lateral diffused PMOSFET (LDPMOS). Referring to FIG. 2E, another embodiment of the ESD protection circuit 320 is illustrated. The first transistor 321 in FIG. 2E is a LDPMOS. The gate of the first transistor 321 is electrically coupled to the second rail 420. In other embodiments, the first transistor 321 can be other P-channel MOSFET or P-type field oxide transistor.

FIG. 2F illustrates another embodiment of the ESD protection circuit 320. FIG. 2F is similar to FIG. 2E except that the ESD protection circuit 320 of FIG. 2F further includes a second transistor 322. The second transistor 322 may be a P-type diffused MOSFET or other P-channel MOSFET such as a P-type field oxide transistor.

Figure 2G:
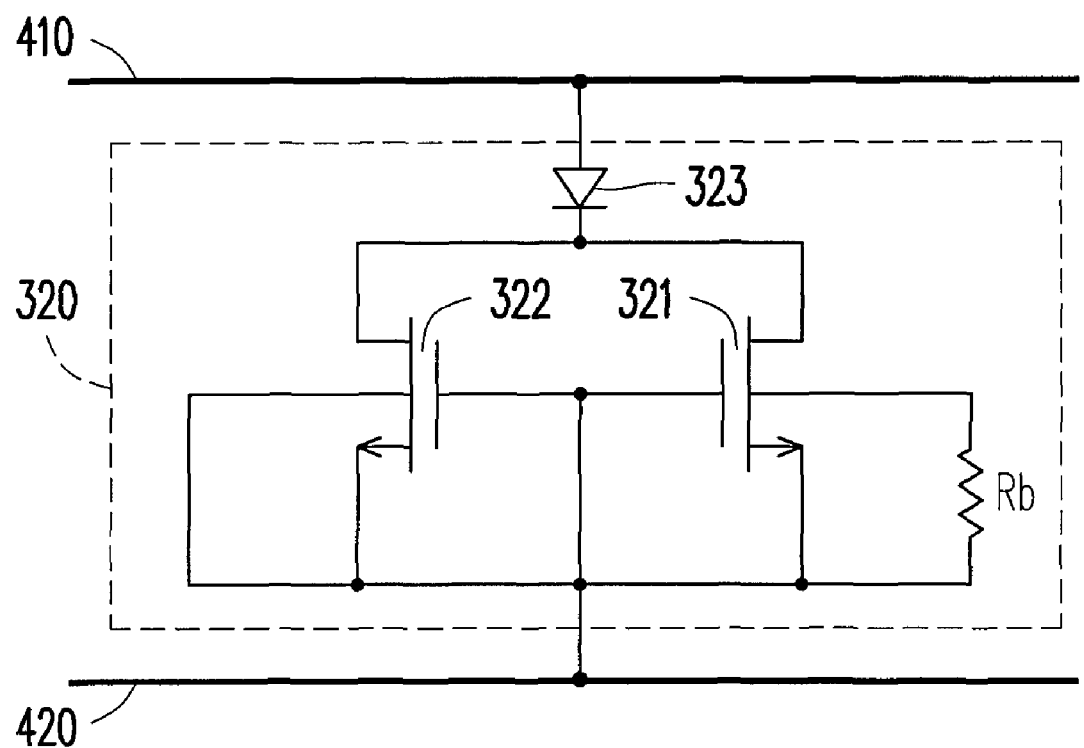

FIG. 2G illustrates another embodiment of the ESD protection circuit 320. FIG. 2G is similar to FIG. 2B except that the ESD protection circuit 320 of FIG. 2G further includes a diode 323. The diode 323 is coupled between the first rail 410 and the drain of the first transistor 321, and is coupled between the first rail 410 and the drain of the second transistor 322. Referring to Table 1, a test to predict system-level ESD performance is carried and the result is shown in Table 1. By referring to table 1, we know that the ESD protection circuit 320 of FIG. 2G can bear larger ESD pulse than the ESD protection circuit 320 of FIG. 2B.

TABLE 1

System ESD Performance of ESD protection circuit

| | ESD protection circuit | |
| --- | --- | --- |
| TLU (Transient latch-up) Immunity | without diode (FIG. 2F) | With diode (FIG. 2G) |
| Positive transient trigger noise (+) | 43 V | 59 V |
| Negative transient trigger noise (−) | −1 V | −14 V |

Figure 3:
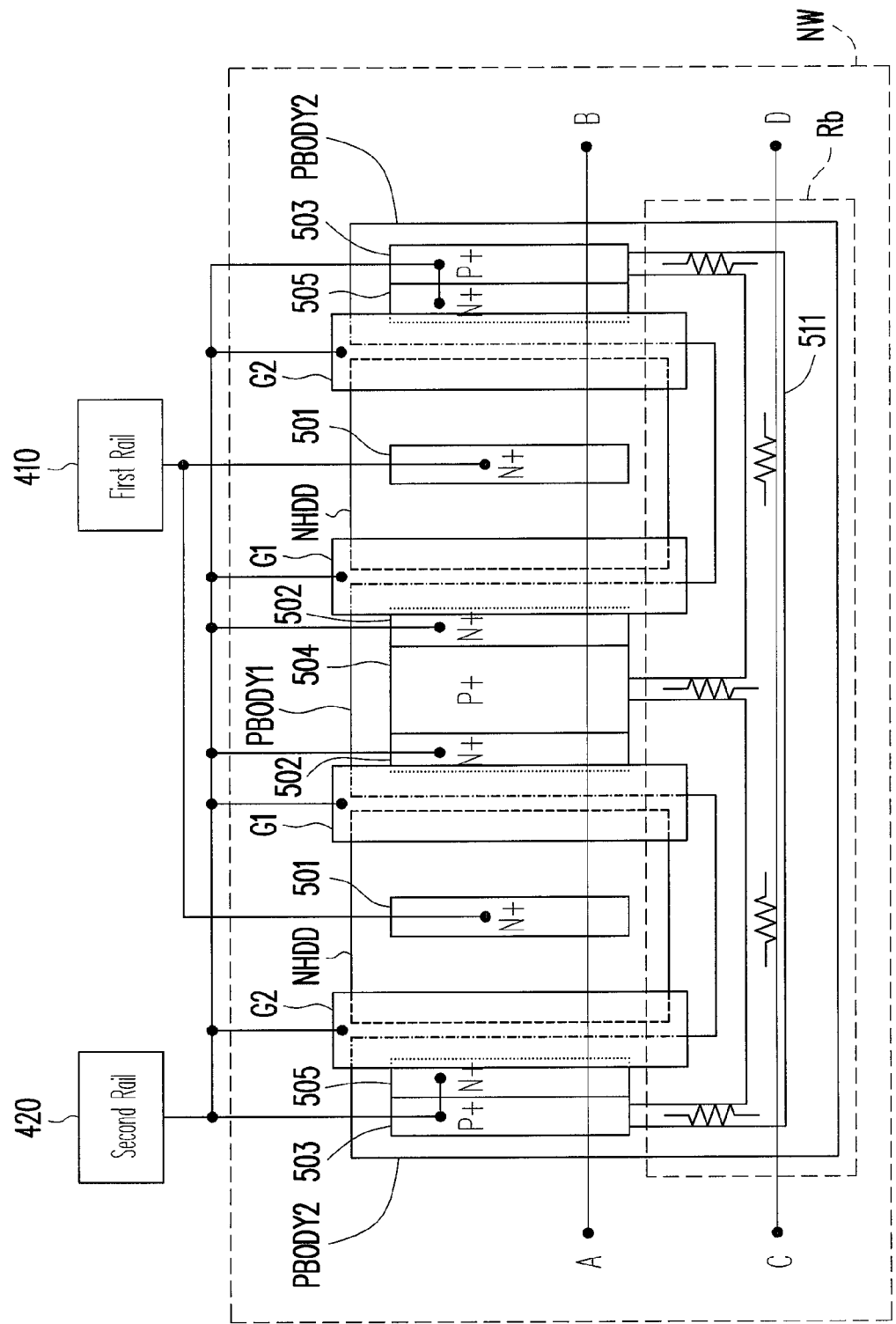
FIG. 3 illustrates a top view of a layout of the circuit according to one embodiment of the present invention.
Figure 4:
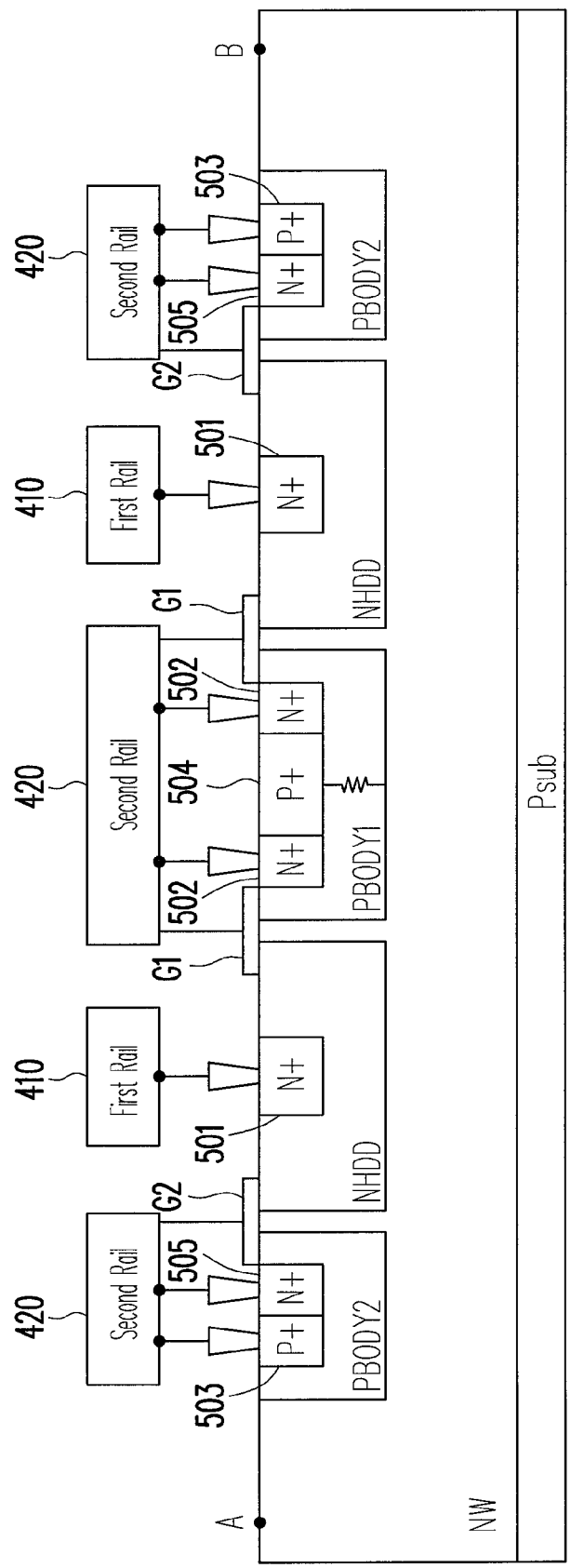
FIG. 4 is a cross-sectional view of the circuit layout taken along line A-B of FIG. 3.
Figure 5:
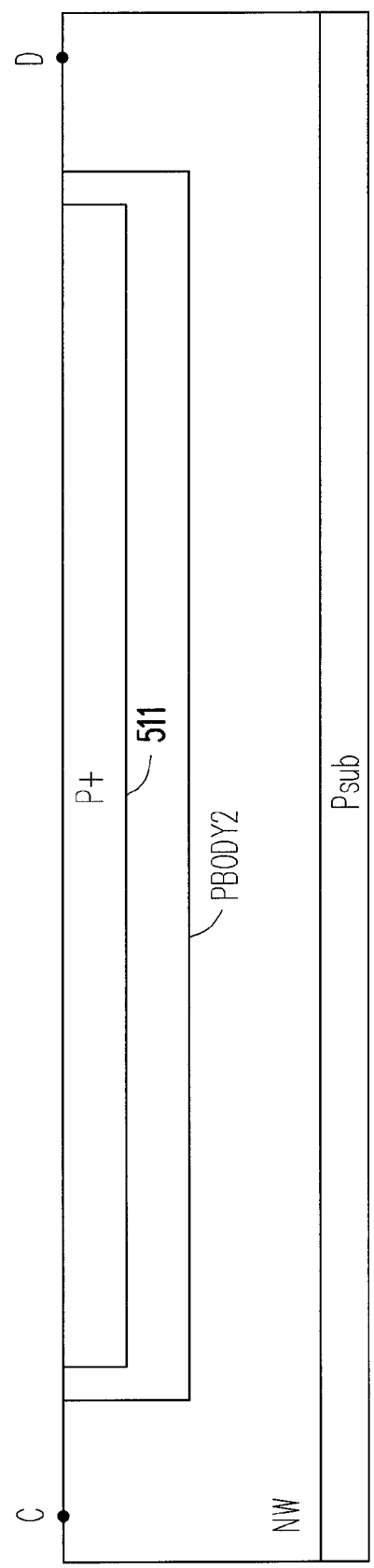
FIG. 5 is a cross-sectional view of the circuit layout taken along line C-D of FIG. 3.

It should be understood that each of the various embodiments described above may be implemented as a partial structure of an entire circuit according to actual requirements. FIG. 3 illustrates a top view of a layout of the circuit of the above embodiments. FIG. 4 is a cross-sectional view of the circuit layout taken along line A-B of FIG. 3. FIG. 5 is a cross-sectional view of the circuit layout taken along line C-D of FIG. 3. A substrate referred to herein may be a substrate of any type, such as, an N-type doped substrate, a P-type doped substrate, or a non-doped substrate. For ease of description, the following embodiment is described with respect to a P-type doped substrate Psub.

Referring to FIGS. 3 to 5, a doped region of a first conductive type (e.g. N-type) is disposed above a substrate. More particularly, in this embodiment, the doped region is implemented with a first well NW. The first well NW is disposed in/above the P-type substrate Psub (Referring to FIG. 4, the location of first well NW can be considered as "disposed above Psub" too). The first well NW can be a high-voltage N-well (HVNW) and formed by any known technology/process. In another embodiment, the first well NW can be replaced with an N-type epitaxial layer (not shown in Figure). In another embodiment, a buried layer (e.g N-type buried layer) can be located between the N-type epitaxial layer and the substrate.

A first body (or bulk) PBODY1 of a second conductive type (P-type in the present embodiment) is disposed in the first well NW. An N-type first heavily doped region 501 may be disposed in the first well NW and located outside of the first body PBODY1. The N-type first heavily doped region 501 can be electrically coupled to the first rail 410. In another embodiment, the first heavily doped region 501 may be disposed in an N-type heavily doped drain (NHDD) that is disposed in the first well NW. An N-type second heavily doped region 502 is disposed in the first body PBODY1 and is electrically coupled to the second rail 420.

Referring again to FIGS. 3 and 4, the layout structure of the ESD protection circuit may further include an N-type fifth heavily doped region 505. The fifth heavily doped region 505 is disposed in a second body PBODY2 and electrically coupled to the second rail 420.

The layout structure of the ESD protection circuit may further include a first gate structure G1 and a second gate structure G2. The first & second gate structure G1 & G2 include a gate and a gate dielectric respectively. The first gate structure G1 is disposed above the first well NW, covers a portion of or the entire region between the first heavily doped region 501 and the second heavily doped region 502, and is electrically coupled to the second rail 420. The second gate structure G2 is disposed above the first well NW, covers a portion of or the entire region between the first heavily doped region 501 and the fifth heavily doped region 505, and is electrically coupled to the second rail 420.

The first gate structure G1, the first heavily doped region 501, the N-type heavily doped drain NHDD, the first well NW, the second heavily doped region 502, and the P-type doped first body PBODY1 collectively form an N-type diffused MOSFET (LDNMOS). The first heavily doped region 501 is the drain of the LDNMOS and the second heavily doped region 502 is the source of the LDNMOS. The LDNMOS can be an example of the first transistor 321 of FIGS. 2A to 2D. The second gate structure G2, the first heavily doped region 501, the N-type heavily doped drain NHDD, the first well NW, the fifth heavily doped region 505 and the P-type doped second body PBODY2 also collectively form an LDNMOS. The first heavily doped region is the drain of the LDNMOS and the fifth heavily doped region 505 is the source of the LDNMOS. This LDNMOS can be an example of the second transistor 322 of FIG. 2B.

Referring to FIGS. 3 to 5, a resistance path Rb shown in FIG. 3 can be the resistance unit Rb shown in FIGS. 2A and 2B. In FIG. 3, the P-type doped second body PBODY2 is used as the resistance path Rb between the first body and the second rail. That is, by electrically coupling the second body PBODY2 to the first body PBODY1 and electrically coupling the second body PBODY2 to the second rail 402 through a third heavily doped region 503 (or directly electrically coupling the second body PBODY2 to the second rail 402), the second body PBODY2 can provide a resistance between the first body and the second rail. The second body PBODY2 is disposed in the first well NW to form a resistive current path. In the present embodiment, the resistive current path (i.e. resistance path Rb) can be formed by disposing the second body PBODY2 having a first end adjoining to the first body PBODY1. The P-type doped third heavily doped region 503 is disposed in the second body PBODY2 and electrically coupled to the second rail 420. Therefore, the resistance path Rb may be electrically coupled between the first body PBODY1 (i.e., the body of the first transistor 321) and the second rail 420.

The profile of the layout structure of the above embodiment can be determined based on actual requirements. For example, in FIG. 4, a contact plug in the first heavily doped region 501 that is electrically coupled to the first rail 410 is spaced from the N-type heavily doped drain NHDD by a distance more than or equal to 7 um. The distance between the first heavily doped region 501 and the region covered by the first gate structure G1 may be more than or equal to 7 um. The length of the first gate structure G1 may be more than or equal to 1 um. The region of the first body PBODY1 covered by the first gate structure G1 and its spacer (not shown) may be more than or equal to 0.6 um in width.

It should be noted that the first body PBODY1 and the second body PBODY2 may be considered a same P-type body. In addition, the resistance path Rb is implemented by the first body PBODY1 and the second body PBODY2 that are electrically interconnected. However, this should not be used to limit the present invention. Rather, the resistance path Rb could be implemented in any suitable manner. For example, a P-type heavily doped region 511 may be selectively disposed in the second body PBODY2, a P-type fourth heavily doped region 504 is selectively disposed in the first body PBODY1, and the resistance path Rb is formed by the fourth heavily doped region 504, the heavily doped region 511 and the third heavily doped region 503 that are electrically interconnected. By adjusting the profile (path width and length) and the doping concentration of the P-type heavily doped region 511, the resistance value of the resistance path Rb (the resistance unit Rb of FIGS. 2A and 2B) can be determined accordingly.

Figure 6:
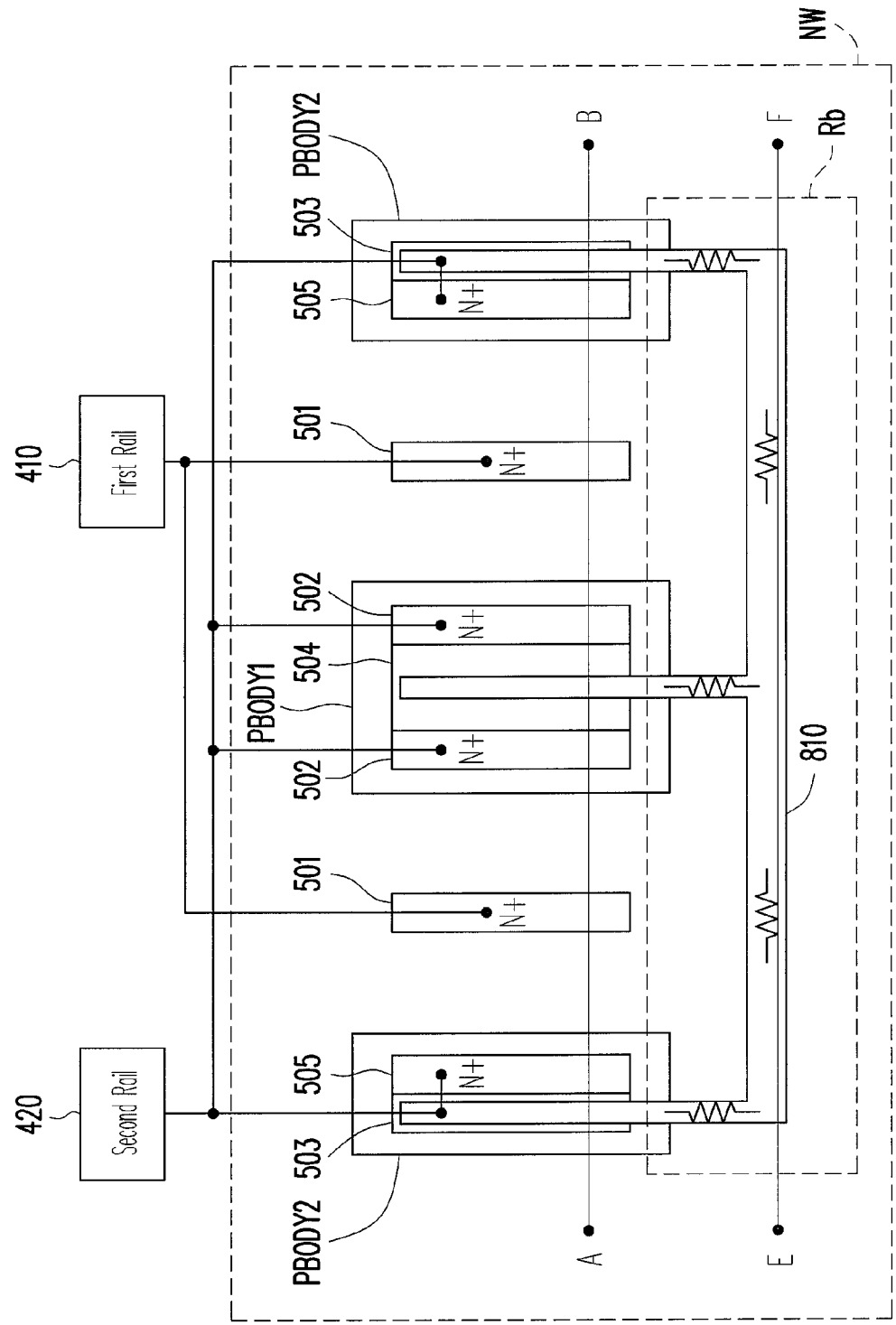
FIG. 6 is a top view of a circuit layout according to another embodiment of the present invention.
Figure 7:
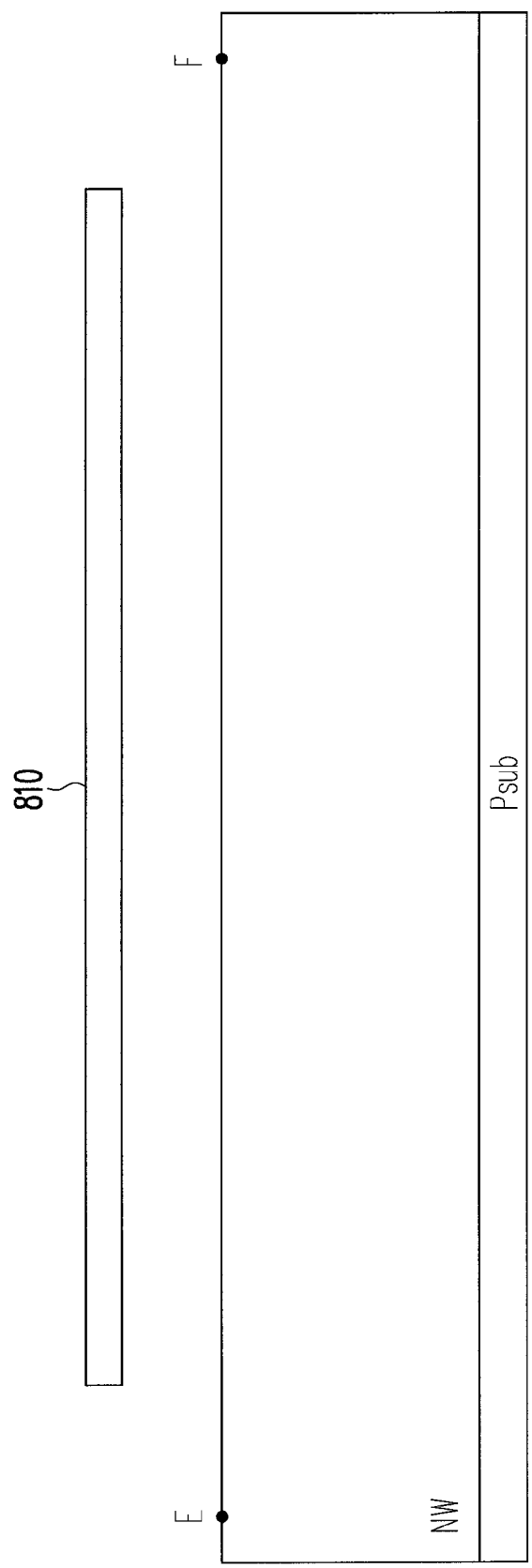
FIG. 7 is a cross-sectional view of the circuit layout of FIG. 6 taken along line E-F.

FIG. 6 is a top view of a circuit layout according to another embodiment of the present invention. FIG. 7 is a cross-sectional view of the circuit layout of FIG. 6 taken along line E-F. The difference between the circuit layout of FIGS. 6 to 7 and the circuit layout of FIGS. 3 to 5 is the implementation of the resistance path Rb.

Referring to FIGS. 6 and 7, a polysilicon interconnect 810 is used to implement the resistance path Rb in the present embodiment. The polysilicon interconnect 810 is disposed above the substrate Psub. First and second ends of the polysilicon interconnect 810 respectively extend to the fourth heavily doped region 504 and the third heavily doped region 503 to form a current path. The first end of the polysilicon interconnect 810 is electrically coupled to the fourth heavily doped region 504 through at least one contact plug (not shown), and the second end of the polysilicon interconnect 810 is electrically coupled to the third heavily doped region 503 through at least one contact plug (not shown). Therefore, the first body PBODY1 may be electrically coupled to the second rail 420 through the fourth heavily doped region 504 and the resistance path Rb (i.e., the polysilicon interconnect 810). In another embodiment, the second end of the polysilicon interconnect 810 may not be electrically coupled to the third heavily doped region 503 through the contact plug but rather is directly electrically coupled to the second rail 420.

Figure 8:
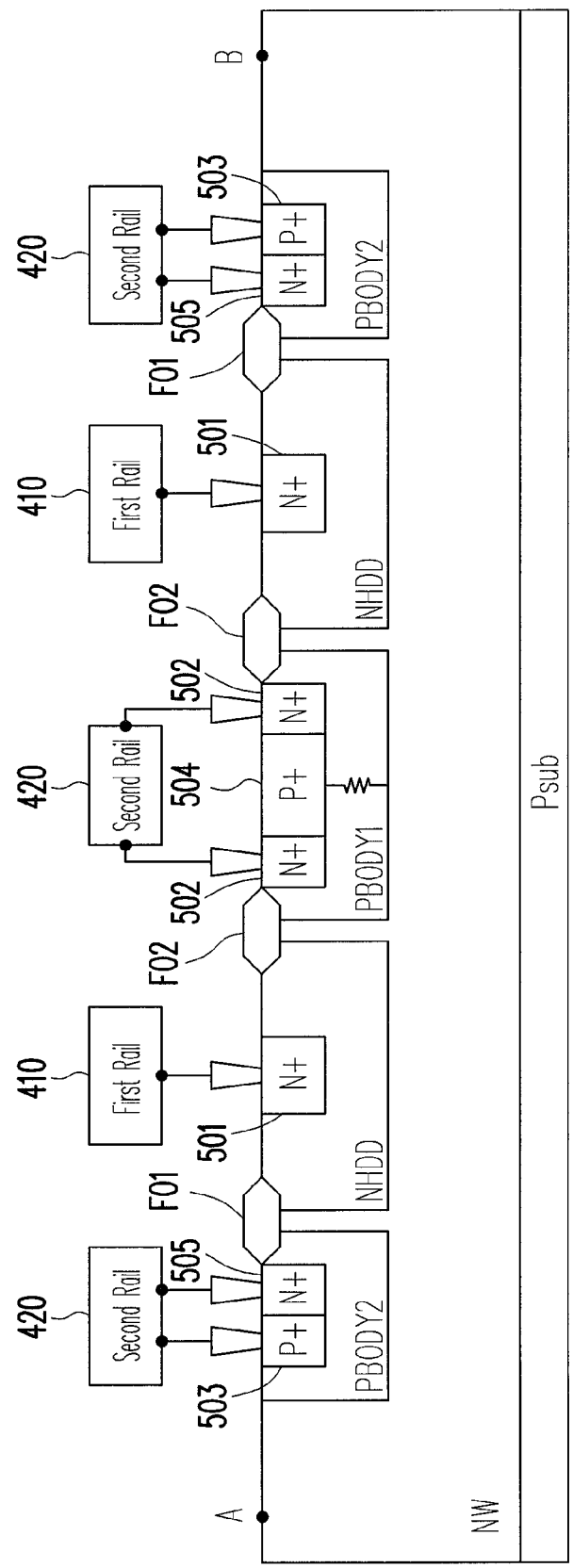
FIG. 8 is a cross-sectional view of a circuit layout according to another embodiment of the present invention.

FIG. 8 is a cross-sectional view of a circuit layout according to another embodiment of the present invention. The top view of the circuit layout of FIG. 8 can be deduced from reference to FIG. 3 and therefore is not repeated herein. The layout of FIG. 8 is similar to the layout of FIG. 4 except that, in the embodiment of FIG. 8, a first field oxide FO1 and a second field oxide FO2 are used to respectively replace the first gate structure G1 and the second gate structure G2 of FIG. 4. The field oxide FO1 and FO2 can be fabricated by a local oxidation (LOCOS) method or other processes. In other embodiments, shallow-trench isolation structures or other isolation structures can be utilized in lieu of the field oxide FO1 and FO2.

Figure 13:
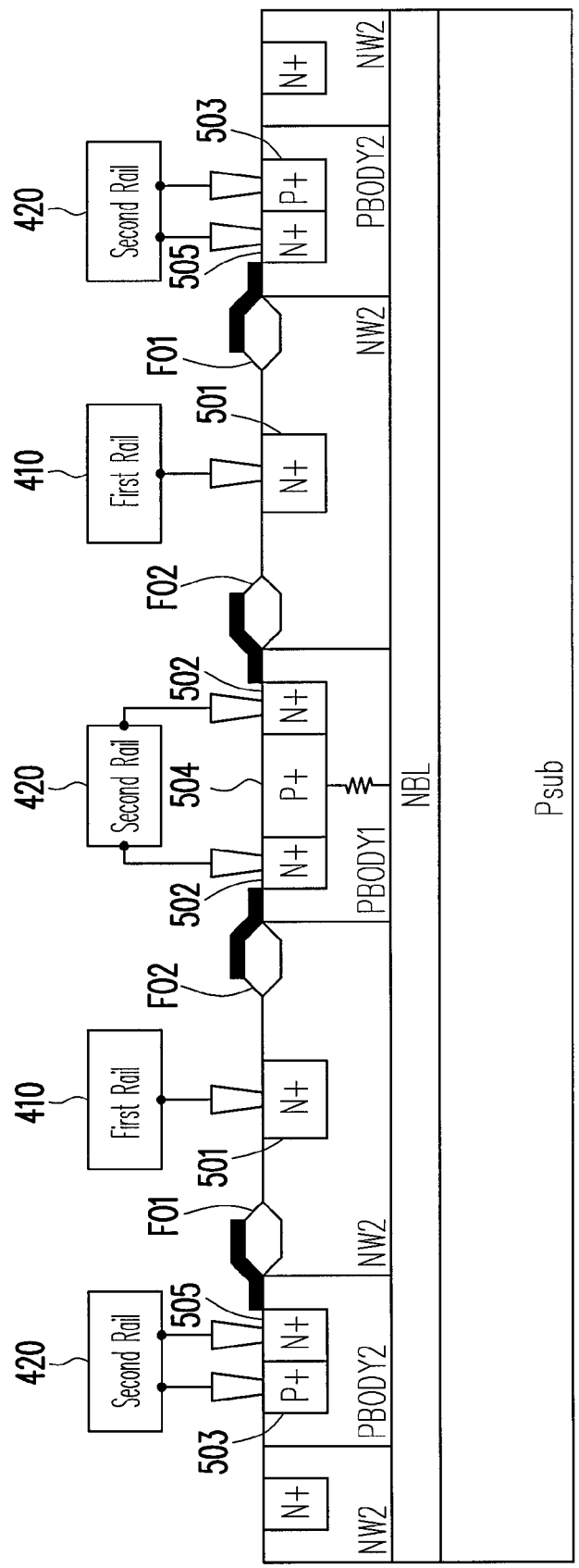
FIG. 13 is a cross-sectional view of a circuit layout according to another embodiment of the present invention.

FIG. 13 is a cross-sectional view of a circuit layout according to another embodiment of the present invention. The layout of FIG. 13 is similar to the layout of FIGS. 4 and 8 except that, in the embodiment of FIG. 13, a bury layer of the first conductive type (e.g. a N-type bury layer NBL) is provided. In this embodiments, the bury layer NBL can be located between the first body PBODY1 and the substrate Psub. More particularly, the bury layer NBL can be disposed in/on the substrate Psub, and the first body PBODY1, the second body PBODY2 and the second well NW2 can be located on the bury layer NBL. The first body PBODY1 and the second body PBODY2 can be isolated from the substrate Psub by the bury layer NBL. In another embodiment, the bury layer NBL can be replaced with an insulating layer (e.g. silicon dioxide layer) (not shown in Figure). In another embodiment, the second well NW2 can be replaced with N-type epitaxial layer.

Figure 9:
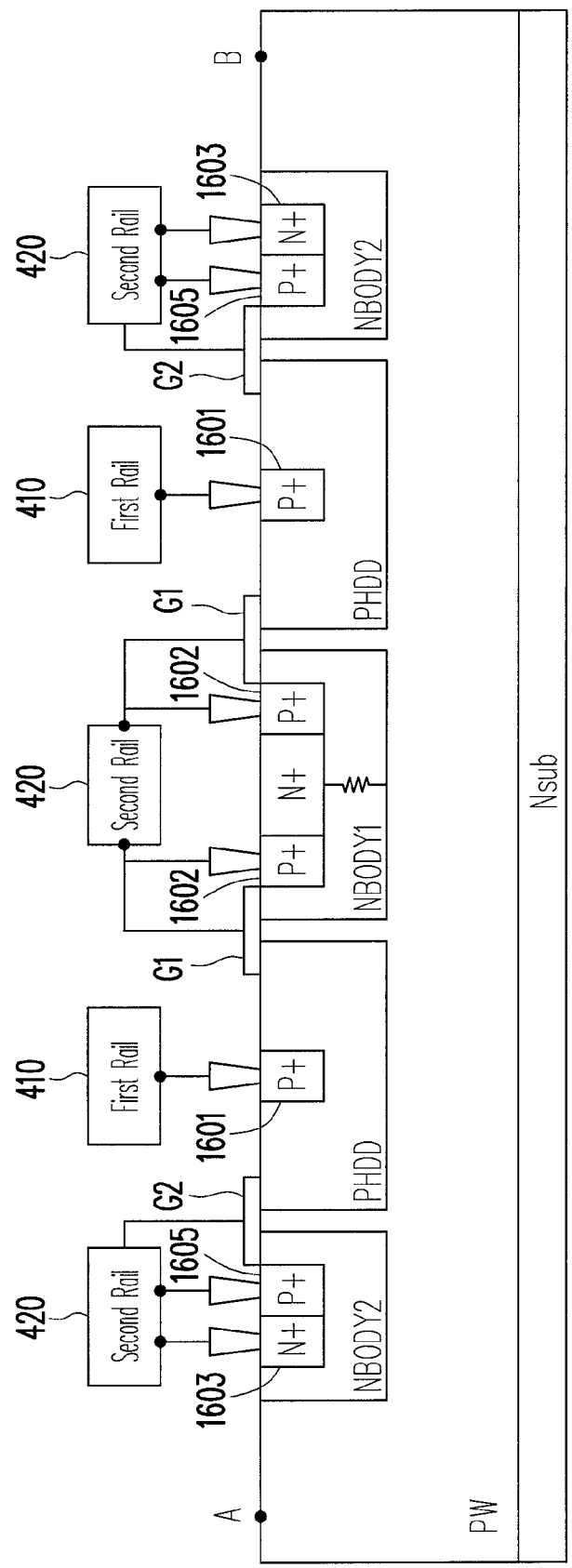
FIG. 9 is a cross-sectional view of a circuit layout according to another embodiment of the present invention.

It should be understood that variations to the above embodiments can be made based on actual requirements. For example, the N-type doping described above can be changed to P-type doping, and the P-type doping described above can be changed to N-type doping. FIG. 9 is a cross-sectional view of a circuit layout according to another embodiment of the present invention. The top view of the circuit layout of FIG. 9 can be deduced from reference to FIG. 3 and therefore is not repeated herein. The substrate referred herein may be any type of substrate, such as, an N-type substrate, a P-type substrate, or a non-doped substrate. For ease of description, the following embodiment is described with respect to the N-type substrate Nsub.

In the present embodiment, a first well PW of the first conductive type (P-type in the present embodiment) is disposed in the N-type substrate Nsub. The first well PW can be a high-voltage P-well (HVPW) and formed by any known technology/process.

A first body or bulk NBODY1 of the second conductive type (N-type in the present embodiment) is disposed in the first well PW. A P-type first heavily doped region 1601 may be disposed in the first well PW and located outside of the first body NBODY1 and is electrically coupled to the first rail 410. In the present embodiment, the first heavily doped region 1601 may be disposed in a P-type heavily doped drain (PHDD) that is disposed in the first well PW. A P-type second heavily doped region 1602 is disposed in the first body NBODY1 and is electrically coupled to the second rail 420.

The layout structure of the ESD protection circuit may further include a P-type fifth heavily doped region 1605. The fifth heavily doped region 1605 is disposed in a second NBODY2 and electrically coupled to the second rail 420.

The layout structure of the ESD protection circuit may further include a first gate structure G1 and a second gate structure G2. The first gate structure G1 is disposed above the first well PW and electrically coupled to the second rail 420. The second gate structure G2 is disposed above the first well PW and electrically coupled to the second rail 420.

The first gate structure G1, the first heavily doped region 1601, the P-type heavily doped drain PHDD, the first well PW, the second heavily doped region 1602, and the N-type doped first body NBODY1 collectively form a P-type diffused MOSFET (LDPMOS). The first heavily doped region 1601 is the drain of the LDPMOS and the second heavily doped region 1602 is the source of the LDPMOS. This LDPMOS can be an example of the first transistor 321 of FIGS. 2E to 2F. The second gate structure G2, the first heavily doped region 1601, the P-type heavily doped drain PHDD, the first well PW, the fifth heavily doped region 1605 and the N-type doped second body NBODY2 also collectively form an LDPMOS. The first heavily doped region 1601 is the drain of the LDPMOS and the fifth heavily doped region 1605 is the source of the LDNMOS. This LDPMOS can be an example of the second transistor 322 of FIG. 2F.

The profile of the layout structure of the above embodiment can be determined based on actual requirements. For example, a contact plug in the first heavily doped region 1601 that is electrically coupled to the first rail 410 is spaced from the P-type heavily doped drain PHDD by a distance more than or equal to 7 um. The distance between the first heavily doped region 1601 and the region covered by the first gate structure G1 may be more than or equal to 7 um. The length of the first gate structure G1 may be more than or equal to 1 um. The region of the first body NBODY1 covered by the first gate structure G1 and its spacer (not shown) may be more than or equal to 0.6 um in width.

Figure 10:
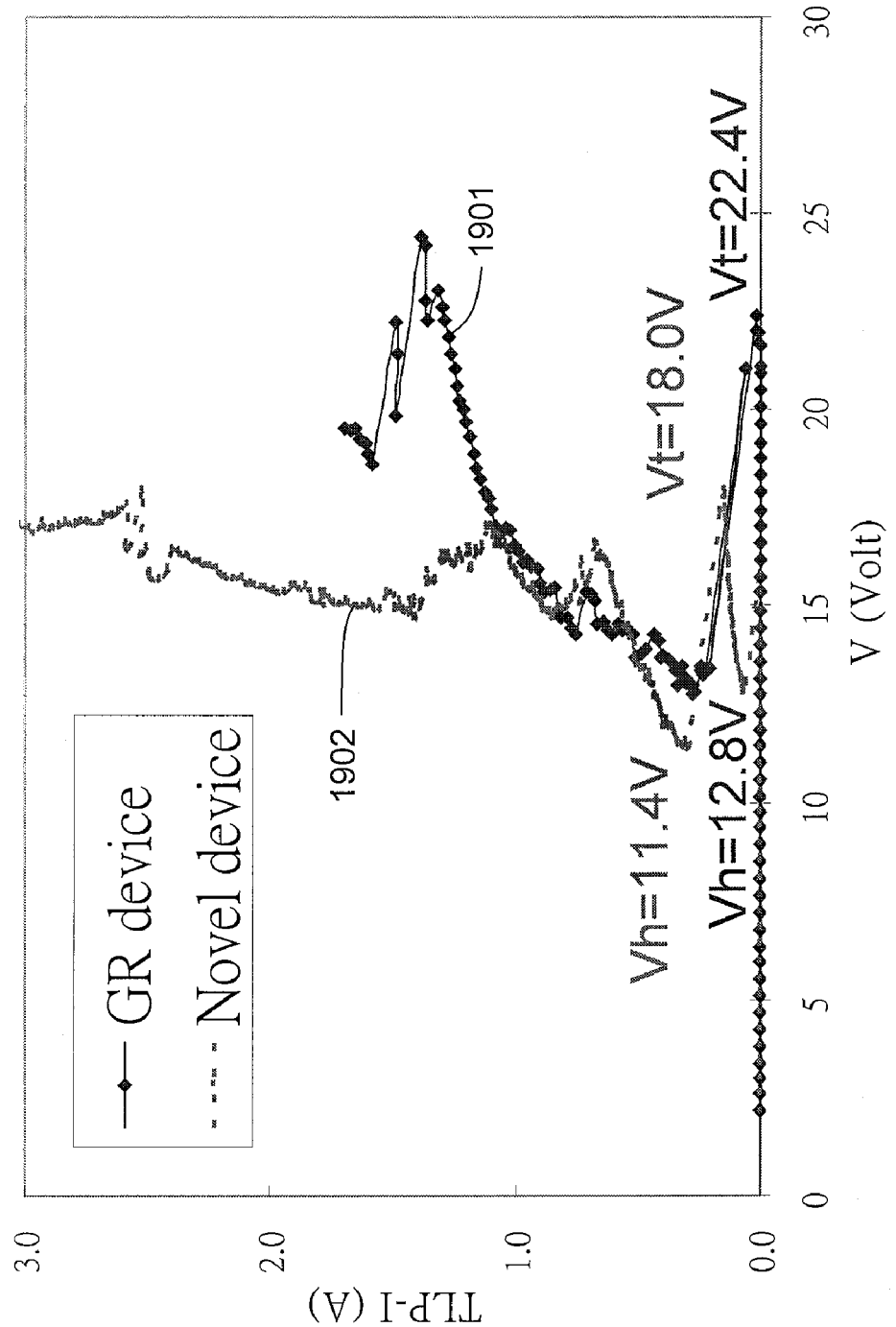
FIG. 10 is a characteristic curve illustrating a comparison between the present embodiment of FIG. 2B and the conventional ESD protection circuit.

FIG. 10 is a characteristic curve illustrating a comparison between the present embodiment of FIG. 2B and the conventional ESD protection circuit. In FIG. 10, the vertical axis represents the ESD current (the unit is Ampere), and the horizontal axis represents the ESD voltage (the unit is Volt). Under same ESD test conditions, the curve 1901 is the current-voltage characteristic curve of the conventional ESD protection circuit, while the curve 1902 is the current-voltage characteristic curve of the ESD protection circuit illustrated in FIG. 2B. The trigger voltage Vt of the conventional ESD protection circuit is approximately 22.4V and the holding voltage Vh is approximately 12.8V. The ESD protection circuit of the present embodiment illustrated in FIG. 2B successfully reduces the trigger voltage Vt to 18.0V and reduces the holding voltage to 11.4V. Therefore, when ESD occurs, the ESD protection circuit illustrated in FIG. 2B can more timely conduct the ESD current to the power rail VSS, thus providing a better protection to the core circuit 101.

Figure 11:
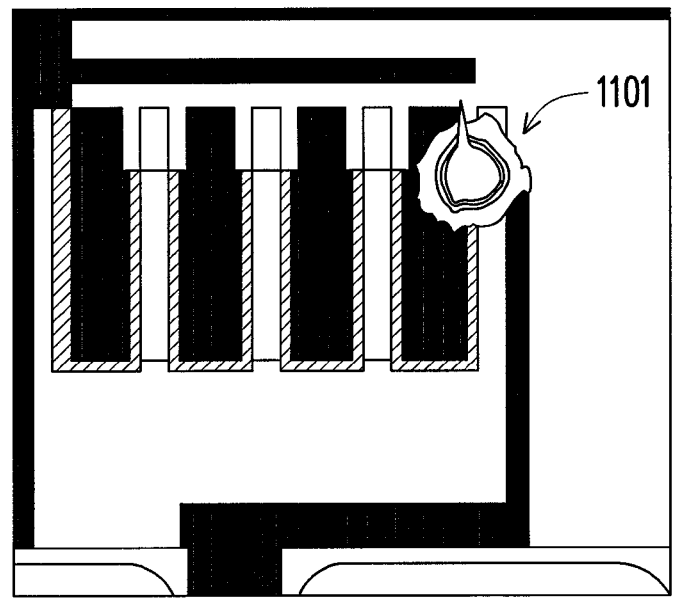
FIG. 11 shows an ESD test result of the conventional ESD protection device.

FIG. 11 shows an ESD test result of the conventional ESD protection device. When ESD occurs on the pad, a large amount of ESD current is conducted to the power rail VSS through the conventional ESD protection device of FIG. 11. However, the conventional ESD protection device has a poor uniform turn-on performance, which results in a concentration of a large amount of ESD current at a certain point (e.g., the burnout point 1101 of the ESD test shown in FIG. 11), such that the ESD current-resistant capability of the conventional ESD protection device is significantly reduced.

Figure 12:
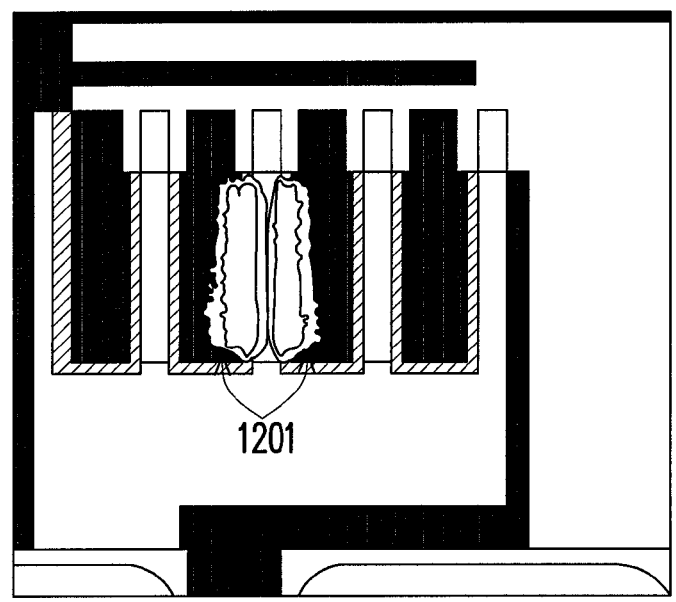
FIG. 12 shows an ESD test result of the ESD protection device of FIG. 3.

FIG. 12 shows an ESD test result of the ESD protection device of FIG. 3. When ESD occurs on the pad 102, a large amount of ESD current is conducted to the power rail VSS through the ESD protection device of FIG. 3. The distribution pattern of the burn-out points 1201 of FIG. 12 can verify that the ESD protection device of FIG. 3 has a good uniform turn-on performance. Due to the good uniform turn-on performance, the large amount of the ESD current can be uniformly distributed, such that the ESD current-resistant capability of the ESD protection device of FIG. 3 can be significantly increased.

In summary, in the various embodiment described above, the body of the first transistor 321 (e.g., N-type transistor) is electrically coupled to the second rail 420 (e.g., power rail Vss or ground) through the resistance unit Rb. Therefore, when ESD occurs on the first rail 410, the resistance unit Rb can provide a resistance between the body of the first transistor 321 and the second rail 420, thus uniformly increasing the voltage level of the body of the first transistor 321. Because the drain-body-source of the first transistor 321 forms a parasitic bipolar junction transistor (e.g., an NPN structure), the body of the first transistor 321 is equivalent to the base of the parasitic bipolar junction transistor. Therefore, when the high voltage level formed on the body through the resistance unit Rb turns the parasitic bipolar junction transistor on, the ESD protection circuit timely provides a current path for the ESD.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An ESD protection device comprising:
a doped region of a first conductive type disposed above a substrate;
a first body of a second conductive type disposed in the doped region as a body of a first transistor;
a first heavily doped region of the first conductive type disposed in the doped region and located outside of the first body, wherein the first heavily doped region is electrically coupled to a first rail;
a second heavily doped region of the first conductive type disposed in the first body, wherein the second heavily doped region is electrically coupled to a second rail;
a resistance path electrically coupled between the first body and the second rail; and
a layer located between the first body and the substrate, the first body being isolated from the substrate by the layer, and the layer being consisted of a bury layer of the first conductive type or a insulating layer.

2. An ESD protection device comprising:
a doped region of a first conductive type disposed above a substrate;
a first body of a second conductive type disposed in the doped region as a body of a first transistor;
a first heavily doped region of the first conductive type disposed in the doped region and located outside of the first body, wherein the first heavily doped region is electrically coupled to a first rail;
a second heavily doped region of the first conductive type disposed in the first body, wherein the second heavily doped region is electrically coupled to a second rail; and
a resistance path electrically coupled between the first body and the second rail, wherein the resistance path is one of a first structure, a second structure or a third structure, wherein
the first structure comprising
 a second body of the second conductive type, wherein a first end of the second body is adjoining to the first body; and
 a third heavily doped region of the second conductive type disposed in the second body and electrically coupled to the second rail;
the second structure comprising
 a fourth heavily doped region of the second conductive type disposed in the first body; and
 a polysilicon interconnect disposed above the substrate to form a current path, wherein the polysilicon interconnect comprises a first end electrically coupled to the fourth heavily doped region and a second end electrically coupled to the second body; and
the third structure comprising
 a second body of the second conductive type disposed in the doped region of the first conductive type and electrically coupled to the second rail;
 a fourth heavily doped region of the second conductive type disposed in the first body; and
 a polysilicon interconnect disposed above the substrate to form a current path, wherein the polysilicon interconnect comprises a first end electrically coupled to the fourth heavily doped region and a second end electrically coupled to the second body.

3. The ESD protection device according to claim 1, further comprising:
a second body of the second conductive type disposed in the doped region as a body of a second transistor, wherein the first heavily doped region is disposed between the first body and the second body;
a third heavily doped region of the second conductive type disposed in the second body and electrically coupled to the second rail; and
a fifth heavily doped region of the first conductive type disposed in the second body and electrically coupled to the second rail.

4. The ESD protection device according to claim 3, further comprising:
a first gate structure disposed above the doped region and the first body, and covering a part of or the entire region between the first heavily doped region and the second heavily doped region, wherein the first gate structure is electrically coupled to the second rail; and
a second gate structure disposed above the doped region and the second body, and covering a part of or the entire region between the first heavily doped region and the fifth heavily doped region.

5. The ESD protection device according to claim 3, further comprising a heavily doped drain of the first conductive type disposed in the doped region and located between the first body and the second body, and the first heavily doped region disposed in the heavily doped drain.

6. The ESD protection device according to claim 3, further comprising:
a first field oxide disposed on the doped region and between the first heavily doped region and the second heavily doped region; and
a second field oxide disposed on the doped region and between the first heavily doped region and the fifth heavily doped region.

7. An ESD protection device comprising:
a doped region of a first conductive type disposed above a substrate;
a first body of a second conductive type disposed in the doped region;
a first heavily doped region of the first conductive type disposed in the doped region and located outside of the first body, wherein the first heavily doped region is electrically coupled to a first rail;
a second heavily doped region of the first conductive type disposed in the first body and electrically coupled to a second rail;
a third heavily doped region of the second conductive type disposed in the first body and being floating, wherein the doped region, the first body, the first heavily doped region, the second heavily doped region and the third heavily doped region collectively form a first transistor; and
a second body of the second conductive type, wherein the second body is adjoining to the first body and electrically coupled to the second rail.

8. The ESD protection device according to claim 2, wherein the second body of the second conductive type is disposed in the doped region as a body of a second transistor, the first heavily doped region is disposed between the first body and the second body.

9. The ESD protection device according to claim 8, further comprising:
a third heavily doped region of the second conductive type disposed in the second body and electrically coupled to the second rail; and
a fifth heavily doped region of the first conductive type disposed in the second body and electrically coupled to the second rail.

10. The ESD protection device according to claim 9, further comprising:
a first gate structure disposed above the doped region and the first body, and covering a part of or the entire region between the first heavily doped region and the second heavily doped region, wherein the first gate structure is electrically coupled to the second rail; and
a second gate structure disposed above the doped region and the second body, and covering a part of or the entire region between the first heavily doped region and the fifth heavily doped region.

11. The ESD protection device according to claim 9, further comprising a heavily doped drain of the first conductive type disposed in the doped region and located between the first body and the second body, and the first heavily doped region disposed in the heavily doped drain.

12. The ESD protection device according to claim 9, further comprising:
- a first field oxide disposed on the doped region and between the first heavily doped region and the second heavily doped region; and
- a second field oxide disposed on the doped region and between the first heavily doped region and the fifth heavily doped region.

13. An ESD protection device comprising:
- a doped region of a first conductive type disposed above a substrate;
- a first body of a second conductive type disposed in the doped region as a body of a first transistor;
- a first heavily doped region of the first conductive type disposed in the doped region and located outside of the first body, wherein the first heavily doped region is electrically coupled to a first rail;
- a second heavily doped region of the first conductive type disposed in the first body, wherein the second heavily doped region is electrically coupled to a second rail; and
- a resistance unit electrically coupled between the body of the first transistor and the second rail and adapted to provide a resistance between the body of the first transistor and the second rail when ESD occurs, wherein the resistance unit is a first resistance unit or a second resistance unit, wherein the first resistance unit comprising:
- a capacitor having a first end electrically coupled to the first rail;
- a resistor having a first end and a second end respectively electrically coupled to a second end of the capacitor and the second rail;
- an inverter having an input electrically coupled to the second end of the capacitor; and
- a third transistor having a body, a drain, a source and a gate, the source and the body of the third transistor electrically coupled to the second rail, the drain of the third transistor electrically coupled to the body of the first transistor, the gate of the third transistor electrically coupled to an output of the inverter; and the second resistance unit comprising:
- a resistor having a first end electrically coupled to the first rail;
- a capacitor having a first end and a second end respectively electrically coupled to a second end of the resistor and the second rail; and
- a third transistor having a drain, a source and a gate, the drain of the third transistor electrically coupled to the body of the first transistor, the source and the body of the third transistor electrically coupled to the second rail, the gate of the third transistor electrically coupled to an output of the resistor.

\* \* \* \* \*